(12) United States Patent
Liszt

(10) Patent No.: US 10,405,406 B2
(45) Date of Patent: Sep. 3, 2019

(54) LED LIGHTING DEVICE WITH COMMUNICATIONS MODULE AND ANTENNA

(71) Applicant: Cree, Inc., Durham, NC (US)

(72) Inventor: Kory A. Liszt, Apex, NC (US)

(73) Assignee: Ideal Industries Lighting LLC, Sycamore, IL (US)

( * ) Notice: Subject to any disclaimer, the term of this patent is extended or adjusted under 35 U.S.C. 154(b) by 361 days.

(21) Appl. No.: 15/190,706

(22) Filed: Jun. 23, 2016

(65) Prior Publication Data

US 2017/0374724 A1 Dec. 28, 2017

(51) Int. Cl.
| | |
|---|---|
| *H05B 37/02* | (2006.01) |
| *F21K 9/235* | (2016.01) |
| *F21K 9/232* | (2016.01) |
| *F21S 8/02* | (2006.01) |
| *F21K 9/278* | (2016.01) |
| *F21K 9/238* | (2016.01) |

(Continued)

(52) U.S. Cl.
CPC ......... *H05B 37/0272* (2013.01); *F21K 9/232* (2016.08); *F21K 9/235* (2016.08); *F21K 9/238* (2016.08); *F21K 9/278* (2016.08); *F21S 8/026* (2013.01); *F21V 7/0008* (2013.01); *F21V 23/009* (2013.01); *F21V 23/045* (2013.01); *F21V 33/00* (2013.01); *H01L 33/486* (2013.01); *H01L 33/502* (2013.01); *F21K 9/233* (2016.08); *F21V 7/005* (2013.01); *F21V 23/001* (2013.01); *F21V 29/70* (2015.01); *F21W 2131/103* (2013.01); *F21Y 2103/10* (2016.08); *F21Y 2115/10* (2016.08)

(58) Field of Classification Search
CPC ............ H05B 33/0854; H05B 33/0863; H05B 37/0218; H05B 37/0227; H05B 37/0236; H05B 37/0281; H05B 37/0272; H05B 33/0842; H05B 33/0803; F21V 5/04; F21V 7/00; F21V 19/003; F21V 29/74; G06F 1/1615; G06F 1/1626; G06F 1/181; F21Y 2115/10; H02J 50/40; H02J 9/065
See application file for complete search history.

(56) References Cited

U.S. PATENT DOCUMENTS

| | | | |
|---|---|---|---|
| 7,213,940 B1 | 5/2007 | Van De Ven et al. | |
| 8,115,448 B2 * | 2/2012 | John ................... | A61N 1/3785 320/108 |

(Continued)

OTHER PUBLICATIONS

U.S. Appl. No. 61/932,058, filed Jan. 27, 2014.

(Continued)

*Primary Examiner* — Haissa Philogene
(74) *Attorney, Agent, or Firm* — Myers Bigel, P.A.

(57) ABSTRACT

A LED lighting device includes LEDs operable to emit light when powered through an electrical path. The LED lighting device includes a housing and a communications module for wireless communication to and from the LED lighting device. An antenna for receives and transmits a wireless signal where the antenna comprises a slot in the housing. A power supply in the electrical path for providing power to the LEDs may be retained in the housing. The communications module may be retained in the housing with the power supply. The housing may form part of the LED lighting device structure such as a reflector surface.

21 Claims, 13 Drawing Sheets

(51) Int. Cl.
  *F21V 7/00*    (2006.01)
  *H01L 33/50*   (2010.01)
  *H01L 33/48*   (2010.01)
  *F21V 23/00*   (2015.01)
  *F21V 33/00*   (2006.01)
  *F21V 23/04*   (2006.01)
  *F21Y 103/10*  (2016.01)
  *F21Y 115/10*  (2016.01)
  *F21W 131/103* (2006.01)
  *F21V 29/70*   (2015.01)
  *F21K 9/233*   (2016.01)

(56) References Cited

U.S. PATENT DOCUMENTS

| | | | |
|---|---|---|---|
| 8,476,836 B2 | 7/2013 | van de Ven et al. | |
| 8,519,566 B2 * | 8/2013 | Recker | H02J 9/065 307/64 |
| 8,638,549 B2 * | 1/2014 | Garelli | G06F 1/1615 361/679.26 |
| 8,736,186 B2 | 5/2014 | Chobot | |
| 8,742,671 B2 | 6/2014 | van de Ven et al. | |
| 8,791,641 B2 | 7/2014 | van de Ven et al. | |
| 8,810,144 B2 | 8/2014 | Hu et al. | |
| 8,823,271 B2 | 9/2014 | van de Ven et al. | |
| 8,829,821 B2 | 9/2014 | Chobot et al. | |
| 8,912,735 B2 | 12/2014 | Chobot et al. | |
| 8,975,827 B2 | 3/2015 | Chobot et al. | |
| 9,101,021 B2 | 8/2015 | Lys | |
| 9,131,561 B2 | 9/2015 | Athalye | |
| 9,155,165 B2 | 10/2015 | Chobot | |
| 9,155,166 B2 | 10/2015 | Chobot | |
| 9,303,823 B2 | 4/2016 | Hu et al. | |
| 9,408,268 B2 * | 8/2016 | Recker | H05B 33/0842 |
| 9,562,677 B2 * | 2/2017 | Negley | F21V 3/0625 |
| 9,618,163 B2 * | 4/2017 | Power | F21V 23/06 |
| 9,900,957 B2 * | 2/2018 | van de Ven | H05B 33/0872 |
| 2013/0026923 A1 | 1/2013 | Athalye et al. | |
| 2013/0162153 A1 | 6/2013 | van de Ven et al. | |
| 2013/0328073 A1 | 12/2013 | Lowes et al. | |
| 2014/0001959 A1 | 1/2014 | Motley et al. | |
| 2014/0167642 A1 | 6/2014 | Chobot | |
| 2014/0268790 A1 | 9/2014 | Chobot et al. | |
| 2015/0102729 A1 | 4/2015 | Creasman et al. | |
| 2015/0312983 A1 | 10/2015 | Hu et al. | |
| 2015/0351187 A1 | 12/2015 | McBryde et al. | |
| 2016/0330824 A1 * | 11/2016 | Recker | H05B 33/0842 |

OTHER PUBLICATIONS

U.S. Appl. No. 14/669,739, filed Mar. 26, 2015.
U.S. Appl. No. 62/292,528, filed Feb. 8, 2016.
U.S. Appl. No. 15/018,375, filed Feb. 8, 2016.

\* cited by examiner

LED LIGHTING DEVICE WITH COMMUNICATIONS MODULE AND ANTENNA

BACKGROUND

Light emitting diode (LED) lighting devices are becoming more prevalent as replacements for older lighting systems. LED lighting devices are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid-state lighting device may take the form of a lighting unit, light fixture, light bulb, or a lamp.

An LED lighting device may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a lighting device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

LED lighting devices typically include LED electronics such as a driver to convert high voltage alternating current supply to the low voltage direct current used by the LEDs and to protect the LEDs from voltage and/or current fluctuations. The drivers may be internal to the lighting device such as commonly found in LED lamps that are intended to replace legacy light bulbs or external such as found in commercial luminaires such as troffer style luminaires.

It is also known to provide wireless capabilities in a LED lighting device for receiving, and/or transmitting, a radio signal or other wireless signals between the lamp and input devices and/or between lamps.

SUMMARY OF THE INVENTION

In some embodiments a LED lighting device comprises at least one LED operable to emit light when powered through an electrical path. Lamp electronics in the electrical path provide power to the LEDs. An electronics housing retains the lamp electronics. A communications module enables wireless communication to and from the LED lighting device. An antenna receives and transmits a wireless signal where the antenna comprises a slot in the housing.

The communications module may be retained in the housing. The antenna may be a cavity-backed antenna. The slot may comprise a linear slot. The linear slot may have a length significantly greater than its width. A voltage source may be applied across the width of the slot to induce an E-field distribution within the slot. The slot may comprise a plurality of slots. A voltage source may be applied across each of the plurality of slots to induce an E-field distribution within each of the plurality of slots. The housing may be separately mounted to the lighting device.

In some embodiments a LED lighting device comprises at least one LED operable to emit light when powered through an electrical path. Lamp electronics in the electrical path provide power to the LEDs. The lamp comprises a housing. A communications module enables wireless communication to and from the LED lighting device. An antenna receives and transmits a wireless signal where the antenna comprises a slot in the housing.

The communications module may be retained in the housing. The lamp electronics may be retained in the housing. The housing may form part of a lamp housing. The housing may form part of a reflector surface. The housing may comprise a first portion that forms part of the antenna and a second portion that does not form part of the antenna. The first portion may be visually indistinguishable from the second portion. The antenna may be a cavity-backed antenna. The slot may comprise a linear slot having a length significantly greater than its width. A voltage source may be applied across the slot to induce an E-field distribution within the slot. The slot may comprise a plurality of slots.

DETAILED DESCRIPTION

Figure 1:
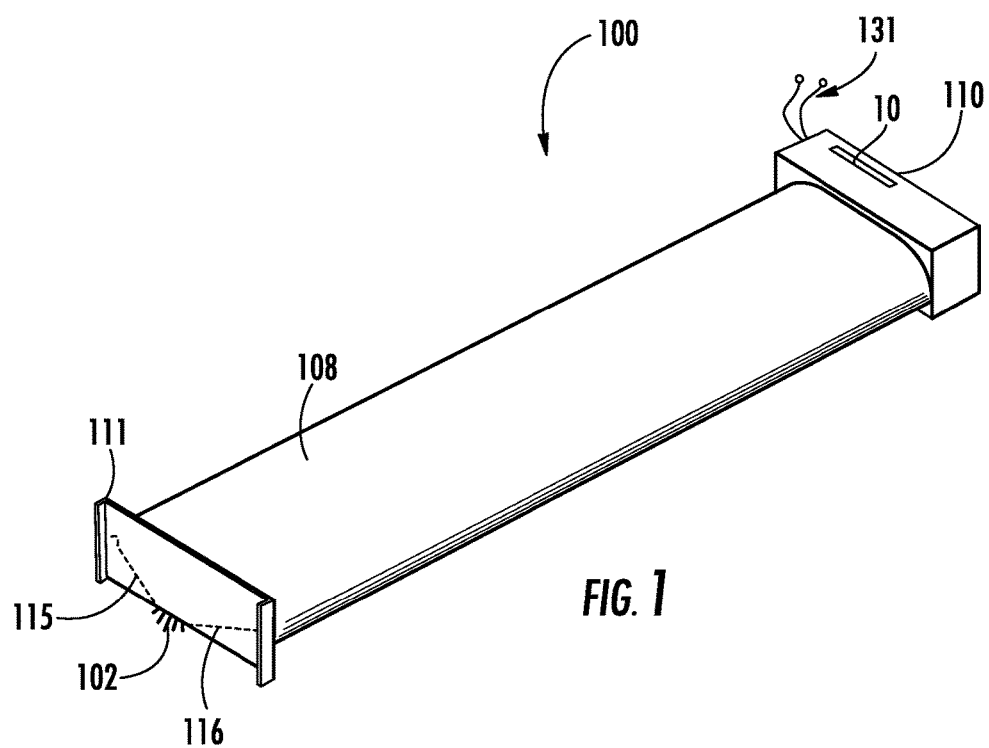
FIG. 1 is a perspective view showing a lighting device according to embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

As used herein, the term LED may comprise packaged LED chip(s) or unpackaged LED chip(s). LED elements or modules of the same or different types and/or configurations. The LEDs can comprise single or multiple phosphor-converted white and/or color LEDs, and/or bare LED chip(s) mounted separately or together on a single substrate or package that comprises, for example, at least one phosphor-coated LED chip either alone or in combination with at least one color LED chip, such as a green LED, a yellow LED, a red LED, etc. The LED module can comprise phosphor-converted white or color LED chips and/or bare LED chips of the same or different colors mounted directly on a printed circuit board (e.g., chip on board) and/or packaged phosphor-converted white or color LEDs mounted on the printed circuit board, such as a metal core printed circuit board or FR4 board. In some embodiments, the LEDs can be mounted directly to the heat sink or another type of board or substrate. Depending on the embodiment, the lighting device can employ LED arrangements or lighting arrangements using remote phosphor technology as would be understood by one of ordinary skill in the art, and examples of remote phosphor technology are described in U.S. Pat. No. 7,614, 759, assigned to the assignee of the present invention and hereby incorporated by reference.

In those cases where a soft white illumination with improved color rendering is to be produced, each LED element or module or a plurality of such elements or modules may include one or more blue shifted yellow LEDs and one or more red or red/orange LEDs as described in U.S. Pat. No. 7,213,940, assigned to the assignee of the present invention and hereby incorporated by reference. In some embodiments, each LED element or module or a plurality of such elements or modules may include one or more blue LEDs with a yellow or green phosphor and one or more blue LEDs with a red phosphor. The LEDs may be disposed in different configurations and/or layouts as desired, for example utilizing single or multiple strings of LEDs where each string of LEDs comprise LED chips in series and/or parallel. Different color temperatures and appearances could be produced using other LED combinations of single and/or multiple LED chips packaged into discrete packages and/or directly mounted to a printed circuit board as a chip-on-board arrangement. In one embodiment, the light source comprises any LED, for example, an XP-Q LED incorporating TrueWhite® LED technology or as disclosed in U.S. patent application Ser. No. 13/649,067, filed Oct. 10, 2012, entitled "LED Package with Multiple Element Light Source and Encapsulant Having Planar Surfaces" by Lowes et al., the disclosure of which is hereby incorporated by reference herein, as developed and manufactured by Cree, Inc., the assignee of the present application. If desirable, other LED arrangements are possible. In some embodiments, a string, a group of LEDs or individual LEDs can comprise different lighting characteristics and by independently controlling a string, a group of LEDs or individual LEDs, characteristics of the overall light out output of the device can be controlled.

In some embodiments, each LED element or module may comprise one or more LEDs disposed within a coupling cavity with an air gap being disposed between the LED element or module and a light input surface. In any of the embodiments disclosed herein each of the LED element(s) or module(s) can have different or the same light distribution, although each may have a directional emission distribution (e.g., a side emitting distribution), as necessary or desirable. More generally, any lambertian, symmetric, wide angle, preferential-sided or asymmetric beam pattern LED element(s) or module(s) may be used as the light source.

Moreover, depending on the embodiment, the desired light distribution can be achieved by single primary optics of packaged LEDs and/or combinations of the primary optics of packaged LEDs with single or multiple secondary optics. Optical components can be the same or vary from LED element to LED element depending on the desired lighting characteristics of the luminaire. In some embodiments, LED optics can employ waveguide technology where internal reflection of light is utilized along with light extraction features to achieve a desired light distribution.

In some embodiments a wireless communications module may be provided in the LED lighting device for receiving, and/or transmitting a wireless signal between the lighting device and remote input/output devices and/or between lighting devices. The wireless communications module and related smart technologies may be used in any of the embodiments of the lighting devices as described herein. The wireless communications module may convert the radio wave to an electronic signal that may be delivered to the LED electronics for controlling operation of the lighting device. The wireless communications module may also be used to transmit a wireless signal from the lighting device to other lighting devices or to remote input/output devices. In various embodiments described herein various smart technologies may be incorporated in the lamps as described in the following applications "Solid State Lighting Switches and Fixtures Providing Selectively Linked Dimming and Color Control and Methods of Operating," application Ser. No. 13/295,609, filed Nov. 14, 2011, which is incorporated by reference herein in its entirety; "Master/Slave Arrangement for Lighting Fixture Modules," application Ser. No. 13/782,096, filed Mar. 1, 2013, which is incorporated by reference herein in its entirety; "Lighting Fixture for Automated Grouping," application Ser. No. 13/782,022, filed Mar. 1, 2013, which is incorporated by reference herein in its entirety; "Multi-Agent Intelligent Lighting System," application Ser. No. 13/782,040, filed Mar. 1, 2013, which is incorporated by reference herein in its entirety; "Routing Table Improvements for Wireless Lighting Networks," application Ser. No. 13/782,053, filed Mar. 1, 2013, which is incorporated by reference herein in its entirety; "Commissioning Device for Multi-Node Sensor and Control Networks," application Ser. No. 13/782,068, filed Mar. 1, 2013, which is incorporated by reference herein in its entirety; "Wireless Network Initialization for Lighting Systems," application Ser. No. 13/782,078, filed Mar. 1, 2013, which is incorporated by reference herein in its entirety; "Commissioning for a Lighting Network," application Ser. No. 13/782,131, filed Mar. 1, 2013, which is incorporated by reference herein in its entirety; "Ambient Light Monitoring in a Lighting Fixture," application Ser. No. 13/838,398, filed Mar. 15, 2013, which is incorporated by reference herein in its entirety; "System, Devices and Methods for Controlling One or More Lights," application Ser. No. 14/052,336, filed Oct. 10, 2013, which is incorporated by reference herein in its entirety; and "Enhanced Network Lighting," Application No. 61/932,058, filed Jan. 27, 2014, which is incorporated by reference herein in its entirety; and "Lighting Device with Operation Responsive to Geospatial Position" application Ser. No. 14/669,739, filed Mar. 26, 2015, which is incorporated by reference herein in its entirety.

Additionally, any of the luminaire embodiments described herein can include the smart lighting control technologies disclosed in U.S. Provisional Application Ser. No. 62/292,528, titled "Distributed Lighting Network", filed on Feb. 8, 2016 and assigned to the same assignee as the present application, the entirety of this application being incorporated herein by reference.

Figure 2:
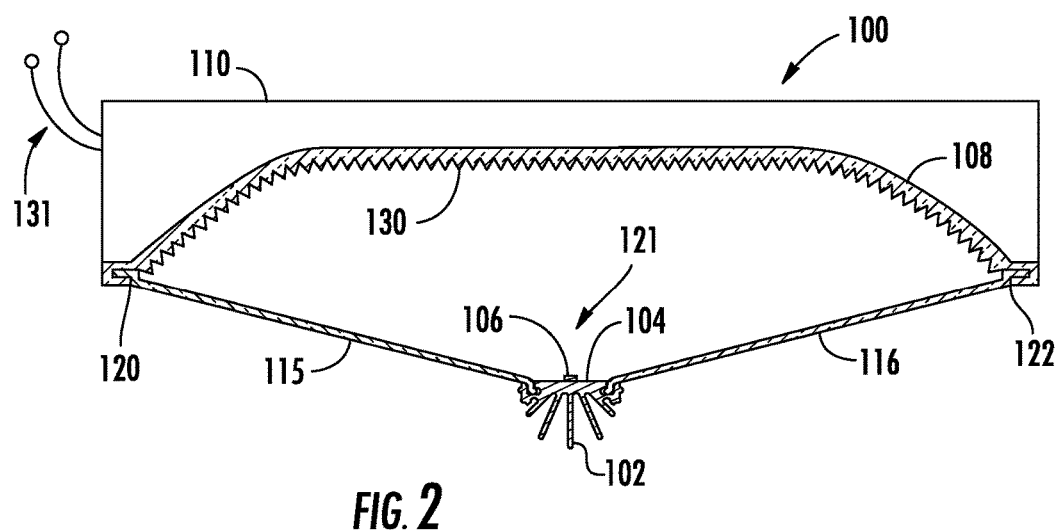
FIG. 2 is a section view of the lighting device of FIG. 1.

Lighting devices embodying the communications module of the invention may be provided in a wide variety of form factors and may comprise LED lamps or bulbs that may be installed in a light fixture, complete LED light fixtures, LED luminaires or the like. In the embodiment of FIGS. 1 and 2 the lighting device may be a suspended linear light fixture 100 configured to be suspended from a structure such as a ceiling by cables, chains, stanchions or other suitable connection mechanisms (not shown). While one embodiment of a light fixture 100 is shown and described, the invention may be used in any LED lighting device where the benefits of the invention may be realized. Light fixture 100 may include heatsink 102 having a mounting surface 104 on which at least one and typically a plurality of LEDs 106, such as individual LED chips, LED packages or the like, can be mounted or fixed to collectively define an LED array 121 that serves as a light source for the light fixture. The LEDs 106 are thermally coupled to the heat sink 102 such that heat generated by the LEDs may be dissipated to the ambient environment. The LEDs 106 can be mounted directly on the heatsink 102, depending on the material and provisions for wiring the LEDs. Alternatively, the LEDs 106 may be mounted on and electrically coupled to an electrically conductive submount such as a printed circuit board (PCB), metal core printed circuit board (MCPCB), lead frame structure, flex circuit or the like. The submount can be mounted on the heatsink 102. The LEDs 106 can be mounted to face orthogonally to the mounting surface 104 to face the center region of the reflector 108, or they may be angled or tilted to face other portions of the reflector.

Light fixture 100 also includes reflector 108 and end caps 110 and 111. In the illustrated embodiment end cap 110 is larger than end cap 111 and is configured to act as a circuit box or electronics housing to retain LED electronics used to drive and control the light source such as rectifiers, regulators, timing circuitry, and other components and to contain a communications module as will be described. In other embodiments, a second end cap similar to end cap 111 may be used and the circuit box or electronics housing that retains the LED driver module and communications module may be mounted to, or be formed as part of, the light fixture as a separate component. Electrical conductors, such as wiring, 131 extend from a power source to the LED electronics in the electronics housing 110. The light fixture shown in FIGS. 1 and 2 is made by way of example only and the system of the invention may be used in light fixtures having a wide variety of configurations.

In the example embodiments of FIGS. 1 and 2, reflector 108 includes a relatively flat region opposite the mounting surface of the heatsink 102; however, a reflector for a light fixture according to embodiments of the invention can take various shapes. For example, reflector 108 could be parabolic in shape, or include two or more parabolic regions. Light fixture 100 also includes two optional lenses 115 and 116 disposed at the sides of the heatsink. The lenses 115, 116 may be made of an optically transmissive material such as plastic material such as polycarbonate. The reflector 108 may be made of an optically reflective material such as metal, white plastic such as polycarbonate or the like. In the perspective view of FIG. 1 the outline of the lenses 115, 116 is shown in dotted lines since the plates are not normally visible from this angle. In this particular embodiment, the lenses and the reflector are coextruded, resulting in a strong mechanical and/or chemical interlock at points 120 and 122. However, if such lenses are used, they can be attached to the light fixture in other ways, including by being removably retained in channels formed with or in the reflector 108, by mechanical fasteners, adhesive or the like. The lenses may also be attached to the end caps 110 and 111. Also visible in FIG. 2 is texturing 130 on the inside surface of reflector 108 facing LED devices 106. The texturing, in this particular example, is a prismatic pattern. Other patterns could also be used and prismatic patterns can vary greatly. In other examples, the reflector may be textured with a roughening pattern on surface. For example, the pattern may be applied by sandblasting, but any number of other methods of creating a roughening pattern on the inside or downward facing surface of reflector 108 can be used. In other embodiments of the invention, reflectors that include diffusive lenses or lens plates, windows, or clear areas in the reflector itself to allow for up-lighting may be used.

It should be noted that in FIG. 2 as well as in some of the other figures, the size and/or thickness of the texturing is not to scale and is exaggerated for illustration. Structures in any of the drawings may be sized to show detail without regard to the scale of a structure relative to other parts of a drawings or to parts shown in other drawings. Also, shapes may be exaggerated or simplified as appropriate for illustrative purposes.

Figure 3:
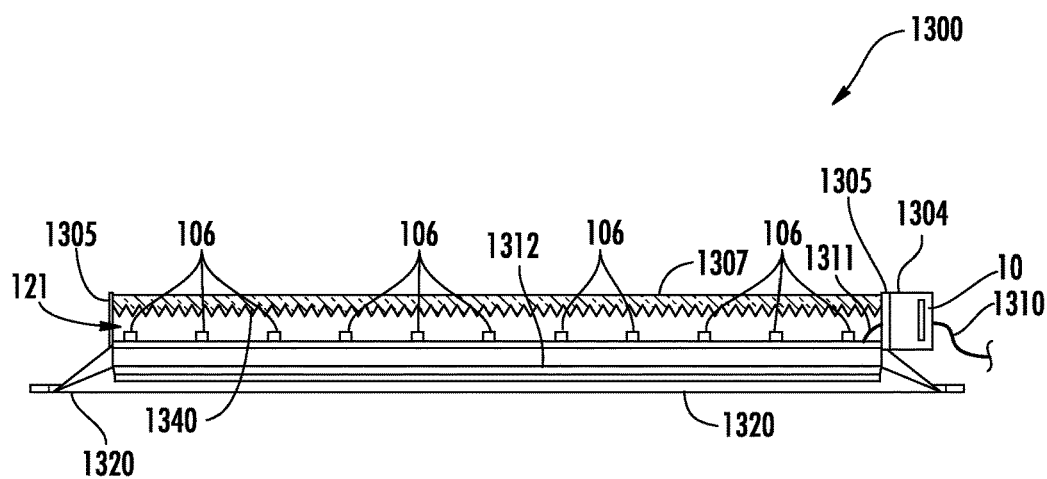
FIG. 3 is a section view taken along line 3-3 of FIG. 4.
Figure 4:
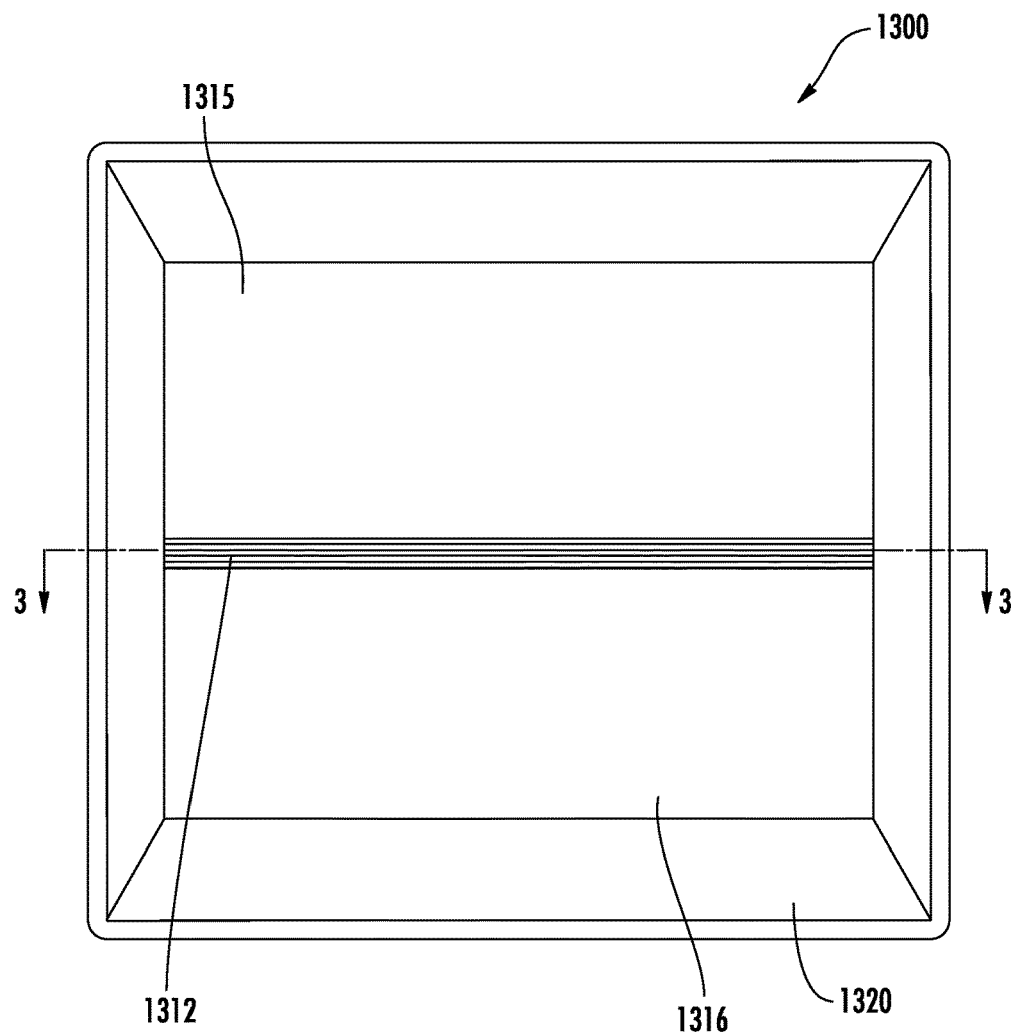
FIG. 4 is a bottom view of another embodiment of a lighting device.

FIGS. 3 and 4 show another embodiment of a light fixture 1300 that is similar to that previously described with respect to FIGS. 1 and 2, except that it is square in shape and includes a reflector with a metal substrate 1307 and a metal support structure or lamp housing 1320. Electronics housing or circuit box 1304 is attached to the backside of the light fixture. The terms "circuit box" and "electronics housing" are used herein to describe the enclosure for the driver module and communications module and in some embodiments refers to a UL approved housing. The term "lamp housing" is used herein to describe the support structure of the lamp that supports and retains the light engine of the lamp and may include reflectors, frames, housings, casings, supporting mechanisms and the like. Electronics housing 1304 houses electronics used to drive and control the light sources such as the driver module and may include rectifiers, regulators, timing circuitry, and other components and a communications module. In this embodiment the light fixture includes two end plates 1305 and the circuit box or electronics housing 1304 is attached to one of the endplates as a separate component. In this embodiment the reflector includes a metal substrate 1307 and a separate reflective material 1309, which may be a white reflective, specular or semi-specular material such as polycarbonate. The material may have a textured inner surface as previously discussed.

Electrical conductors, such as wiring, 1310 extend from a power source to the LED electronics in the electronics housing 1304. Electrical conductors, such as wiring, 1311 extend from the electronics in the electronics housing 1304 to the LEDs 106, or the LEDs can receive power through an electrically conductive submount mounted on the surface of the heatsink 1312 that receives power through suitable conductors 1311. For example if a submount is used, the conductors 1311 may comprise a wiring harness from the lamp electronics in the electronics housing 1304 to the submount. As shown in FIG. 4, the reflector 1309 may be occluded from view by the lenses 1315 and 1316 and the heatsink 1312. The bottom side of the heatsink 1312 may be exposed to the room environment. The lamp housing 1320 is sized to fit around the light engine and enables the light fixture 1300 to be installed in a ceiling as a troffer.

A multi-chip LED package may be used with embodiments of the invention and can include light emitting diode chips that emit hues of light that, when mixed, are perceived in combination as white light. Phosphors can also be used. Blue or violet LEDs can be used in the LED devices and the appropriate phosphor can be deployed elsewhere within the fixture. LED devices can be used with phosphorized coatings packaged locally with the LEDs to create various colors of light. For example, blue-shifted yellow (BSY) LED devices can be used with a red phosphor on or in a carrier or on the reflector to create substantially white light, or combined with red emitting LED devices on the heatsink to create substantially white light. Such embodiments can produce light with a CRI of at least 70, at least 80, at least 90, or at least 95. By use of the term substantially white light, one could be referring to a chromaticity diagram including a blackbody locus of points, where the point for the source falls within four, six or ten MacAdam ellipses of any point in the blackbody locus of points.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. Each of the former, blue LEDs are packaged with a phosphor that, when excited, emits light having a dominant wavelength from 560 to 580 nm, so as to form a blue-shifted-yellow LED device. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Figure 11:
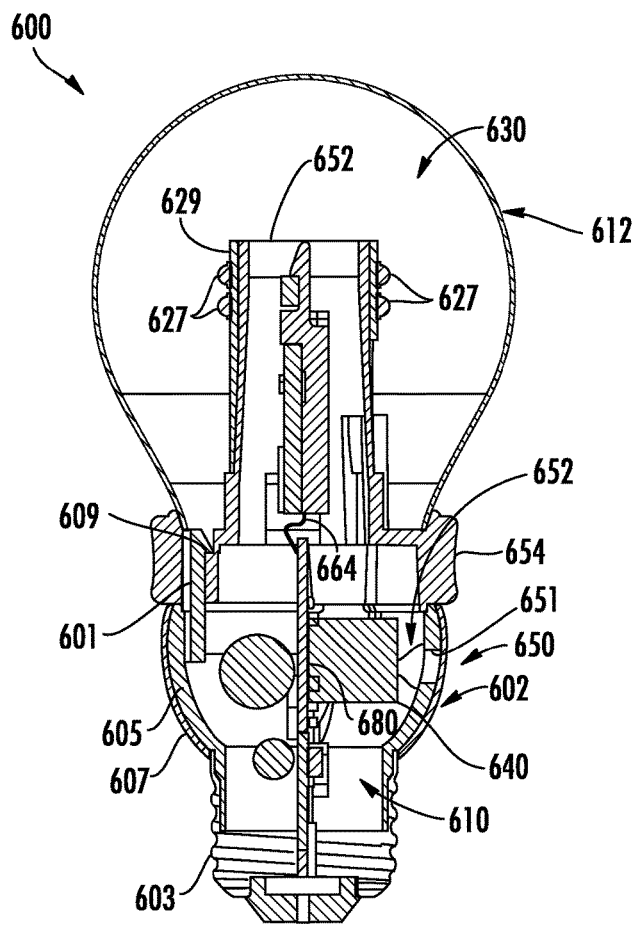
FIG. 11 is a section view showing a lighting device according to other embodiments of the invention.

The various parts of an LED fixture according to example embodiments of the invention can be made of any of various materials. Heatsinks can be made of metal or heat conductive plastic, as can the various portions of the housings for the components of a fixture. A lighting device according to embodiments of the invention or portions of such a lighting device can be assembled using varied fastening methods and mechanisms for interconnecting the various parts. For example, in some embodiments locking tabs and mating receptacles may be used to join various components together in a snap-fit connection (see for example tabs 601 and receptacles 609 as shown in FIG. 11). In some embodiments, combinations of fasteners such as tabs, latches or other suitable fastening arrangements and combinations of fasteners can be used which would not require adhesives or screws. In other embodiments, adhesives, screws, bolts, or other fasteners may be used to fasten together the various components.

Figure 5:
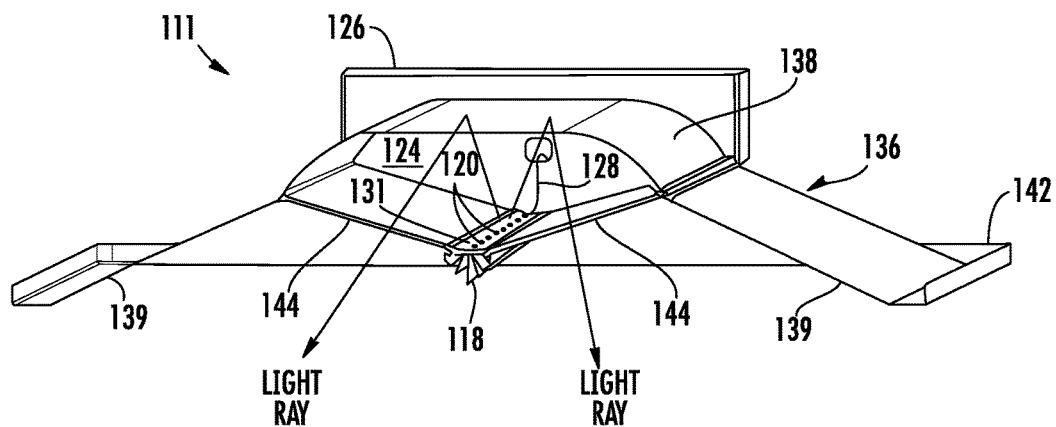
FIG. 5 is a perspective section view of another embodiment of a lighting device.
Figure 6:
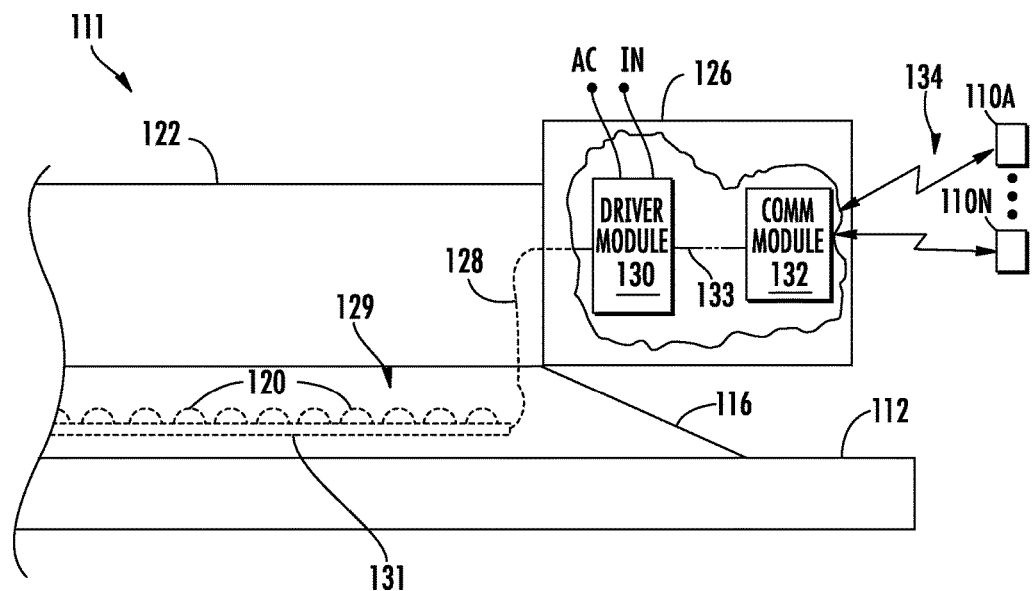
FIG. 6 is a schematic side view of the lighting device of FIG. 5.

FIGS. 5 and 6 show schematic views of another embodiment of a lighting device 111 suitable for use as a troffer light. The lighting device comprises a heat sink 118 supporting a plurality of LEDs 120 forming an LED array 129. The LEDs 120 may be mounted on a submount 131 as previously described that is mounted to heat sink 118. An electrical connector 128 connects the electrically conductive submount 131 to lamp electronics in electronics housing 126. The lamp may further comprise a lamp housing 136 defining a reflector comprising a first reflector portion 138 that defines a light mixing chamber together with lenses 144 and a second reflector portion 139 that extends outside of the mixing chamber. The second reflector portion 139 may terminate in a flange or other support structure 142 for securing the light fixture to a structure such as a ceiling grid. The lamp housing 136 may be made of metal.

Referring to FIG. 6, in certain embodiments the driver module 130 and the LED array 129 may be connected to form core LED electronics of the lighting device 111, and the communications module 132 may be configured to bidirectionally communicate with other lighting devices as well as one or more remote input/output devices 110A-110N via wireless interfaces 134. The communications module 132 may communicate with one or more external devices such as a input/output devices (which may be embodied in a computer, terminal, LAN, server, smartphone, tablet, wireless remote or the like), with one or more other lighting devices, and with one or more sensors. In certain embodiments a standard communication interface and a protocol may be used between the driver module 130 and the communications module 132 to permit different driver modules to communicate with different communications modules.

The driver module 130 of the LEDs 120 is arranged to drive the LEDs and may provide the primary intelligence for the LEDs and is capable of driving the LEDs in a desired fashion. The driver module includes LED electronics used to drive and control the light source such as rectifiers, regulators, timing circuitry, and other components. Each driver module 130 may be embodied in a single module or component or it may be divided into two or more submodules or subcomponents. When the driver module 130 provides the primary intelligence, the communications module 132 may act as an intelligent communication interface to facilitate communications between the driver module 130 and one or more remote devices 110A-110N. Alternatively, the driver module 130 may be primarily configured to drive the LEDs based on instructions from the communications module 132. In such an embodiment the primary intelligence may be provided on the communications module 132.

Each communications module 132 may be provided with a transceiver or separate transmitters and receivers (referred to collectively herein as "transceiver"). The communications module 132 includes an antenna operatively coupled to the transceiver. Each communications module 132 may be implemented on a printed circuit board (PCB) that may be separate from a PCB associated with the driver module 130 or the driver module 130 and the communications module 132 may be implemented on the same PCB. A processor is configured to provide signals to and receive signals from the transceiver. The signals may include signaling information in accordance with the air interface standard of the applicable cellular system of the wireless telephone network that carries interface 134. In this regard, the communications module 132 may be configured to operate with one or more air interface standards, communication protocols, modulation types, and access types. By way of illustration, the communications module 132 may be configured to operate in accordance with any of a number of first, second, third, and/or fourth-generation communication protocols and/or the like. For example, the communications module 132 may be configured to operate in accordance with second-generation (2G) wireless communication protocols IS-136 (time division multiple access (TDMA)), GSM (global system for mobile communication), and/or IS-95 (code division multiple access (CDMA)), or with third-generation (3G) wireless communication protocols, such as Consolidated Mobile Telecommunications System (UMTS), CDMA2000, wideband CDMA (WCDMA) and/or time division-synchronous CDMA (TD-SCDMA), with fourth-generation (4G) wireless communication protocols, with LTE protocols, with 3GPP protocols and/or the like. The communications module 132 may also be configured to operate in accordance with non-cellular communication mechanisms, such as via a wireless local area network (WLAN) or other communication/data networks.

As shown, for example, in FIGS. 5 and 6 the electronics housing 126 may be mounted on the support structure of the lighting fixture to house some or all of the electronics used to power and control the LEDs. The electronics housing may advantageously be mounted on the top of the lighting device where it is hidden from view during normal use of the lighting device; however, it may be mounted at any suitable position on the lighting device. The electronics are electrically coupled to the LED array 129 through appropriate conductors 128. The lamp electronics provided in the electronics housing 126 may be divided into a driver module 130 and a communications module 132.

The driver module and the communications module may be coupled via communication and power buses 133 which may be separate or integrated with one another. A communication bus allows the communications module and the driver module to receive and transmit information to and from one another. An exemplary communication bus is the inter-integrated circuitry bus (I2C), which is a serial bus and may be typically implemented with a two wire interface employing data and clock lines. Other available buses may be used such as serial peripheral interface bus (SPI), Dallas Semiconductor Corporations 1-Wire serial bus, universal serial bus (USP), RS-232, Microchip Technology Incorporated's UNI/O or the like.

Figure 7:
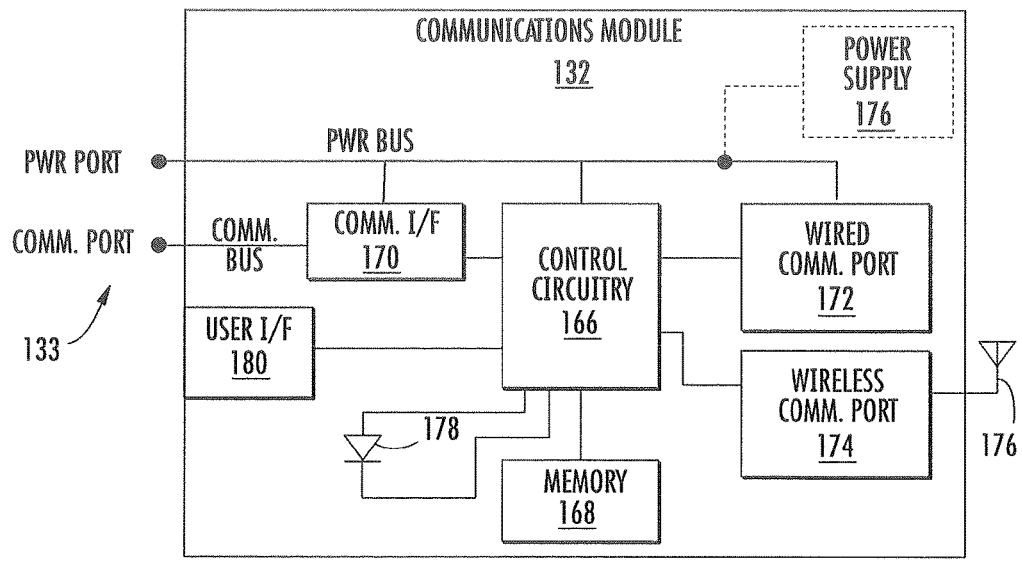
FIG. 7 is a block diagram of an embodiment of a communications module as used in the lighting device of the invention.

A block diagram of a communications module according to one embodiment is provided as shown in FIG. 7. The communications module 132 includes control circuitry 166 and associated memory 168, which contains the software instructions and data to facilitate operation of the communications module. The control circuitry 166 may be associated with a communication interface 170 which is coupled to the driver module 130 either directly or indirectly via the communication bus 133. The control circuitry 166 may be associated with a wireless communication port 174 to facilitate wireless communication with other lighting devices, one or more user input devices, sensors or the like. The wireless communication port 174 may include the requisite transceiver to facilitate wireless communications with remote entities. The wireless communication port further may comprise an antenna 176 for transmitting and receiving the wireless signals.

The antenna may form an integral part of the communications module or the antenna may be formed as a separate component from the communications module that delivers suitable signals to the communications module over a suitable interface. The antenna may form part of the communications module or it may be a separate component. Further, some components used in conjunction with the antenna for receiving and transmitting radio signals may be formed as part of the communications module while other components may be formed separately from the communications module. For example, the antenna comprises a slot formed in a housing that may be connected to a transceiver and other electronics for delivering electric current to the antenna's terminals and for receiving electrical signals from the antenna generated by the received radio wave. The transceiver amplifies and converts the signal and delivers the signal to the lamp electronics where information contained in the signal may be used by the communications module and lamp electronics to control the lighting device. In some embodiments, the transceiver and other antenna electronics may be part of the communications module and may be connected to the slot by suitable conductors. In other embodiments the transceiver and other antenna electronics may be part of a separate antenna module that may be connected to both the slot and the communications module by separate conductors. As used herein the term "communicatively coupled" as used with respect to the antenna and the communications module means that the antenna operates to transmit signals to and from the communications module and that the antenna may form part of the communications module or may be a separate component. In other embodiments the communications module and antenna module may share these components. Moreover the term "module" as used herein may refer to a structural component that may be physically separate from other physical components such that the module forms an integral physical assembly; however, in other embodiments the module may be considered a functional component of the device rather than a physically distinct component where the physical components of the various modules described herein may form part of the same physical structure. For example, the communications module and the driver module may be mounted on the same PCB and form part of a single physical component or the communications module and the driver module may be mounted on different PCBs and comprise different physical components. Moreover, the different modules discussed herein may be embodied in more than one physical component. For example, portions of the communications module or the driver module may be mounted on multiple PCBs that together form one functional module.

Power for the control circuitry 166, memory 168, communication interface 170, wireless communication port 174 and antenna may be provided over the bus 133 via the power port. The power bus may receive power from the driver module 130 or from an AC power source. In some embodiments, power may be provided by an internal power supply such as a battery 176. The communications module 132 may include a status indicator such as LED 178 to indicate the operating status of the communications module. A user interface 180 may be provided to allow a user to manually interact with the communications module to manage and control the operation of the communications module 132.

In some embodiments, the driver module is included in the electronics housing as shown in the various embodiments described herein. The housing may include the power supply or driver and form all or a portion of the electrical path between the mains and the LEDs. The housing may also include only part of the power supply circuitry while some smaller components reside with the LED assembly. Suitable power supplies and drivers are described in U.S. patent application Ser. No. 13/462,388 filed on May 2, 2012 and titled "Driver Circuits for Dimmable Solid State Lighting Apparatus" which is incorporated herein by reference in its entirety; U.S. patent application Ser. No. 12/775,842 filed on May 7, 2010 and titled "AC Driven Solid State Lighting Apparatus with LED String Including Switched Segments" which is incorporated herein by reference in its entirety; U.S. patent application Ser. No. 13/192,755 filed Jul. 28, 2011 titled "Solid State Lighting Apparatus and Methods of Using Integrated Driver Circuitry" which is incorporated herein by reference in its entirety; U.S. patent application Ser. No. 13/339,974 filed Dec. 29, 2011 titled "Solid-State Lighting Apparatus and Methods Using Parallel-Connected Segment Bypass Circuits" which is incorporated herein by reference in its entirety; U.S. patent application Ser. No. 13/235,103 filed Sep. 16, 2011 titled "Solid-State Lighting Apparatus and Methods Using Energy Storage" which is incorporated herein by reference in its entirety; U.S. patent application Ser. No. 13/360,145 filed Jan. 27, 2012 titled "Solid State Lighting Apparatus and Methods of Forming" which is incorporated herein by reference in its entirety; U.S. patent application Ser. No. 13/338,095 filed Dec. 27, 2011 titled "Solid-State Lighting Apparatus Including an Energy Storage Module for Applying Power to a Light Source Element During Low Power Intervals and Methods of Operating the Same" which is incorporated herein by reference in its entirety; U.S. patent application Ser. No. 13/338,076 filed Dec. 27, 2011 titled "Solid-State Lighting Apparatus Including Current Diversion Controlled by Lighting Device Bias States and Current Limiting Using a Passive Electrical Component" which is incorporated herein by reference in its entirety; and U.S. patent application Ser. No. 13/405,891 filed Feb. 27, 2012 titled "Solid-State Lighting Apparatus and Methods Using Energy Storage" which is incorporated herein by reference in its entirety.

Any of the embodiments disclosed herein may include power or driver circuitry having a buck regulator, a boost regulator, a buck-boost regulator, a fly-back converter, a SEPIC power supply or the like and/or multiple stage power converter employing the like, and may comprise a driver circuit as disclosed in U.S. patent application Ser. No. 14/291,829, filed May 30, 2014, entitled "High Efficiency Driver Circuit with Fast Response" by Hu et al. or U.S. patent application Ser. No. 14/292,001, filed May 30, 2014, entitled "SEPIC Driver Circuit with Low Input Current Ripple" by Hu et al. incorporated by reference herein. The circuit may further be used with light control circuitry that controls color temperature of any of the embodiments disclosed herein, such as disclosed in U.S. patent application Ser. No. 14/292,286, filed May 30, 2014, entitled "Lighting Fixture Providing Variable CCT" by Pope et al. incorporated by reference herein. Additionally, any of the embodiments described herein can include driver circuitry disclosed in U.S. patent application Ser. No. 15/018,375, titled Solid State Light Fixtures Having Ultra-Low Dimming Capabilities and Related Driver Circuits and Methods, filed on Feb. 8, 2016 and assigned to the same assignee as the present application, the entirety of this application being incorporated herein by reference.

The term "electrical path" can be used to refer to the entire electrical path to the LED's, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LEDs. Electrical conductors run between the LEDs and the lamp electronics to carry both sides of the supply to provide critical current to the LEDs.

In a typical lighting device the lamp electronics, such as the LED driver module 130, are typically isolated by being mounted in a metal circuit box or electronics housing to meet safety requirements such as UL standards. Ideally the driver module and the communications module would be co-located and mounted in the same housing in order to simplify manufacture and allow for more compact designs. However, placing the antenna of the communications module inside of a metal box such as an electronics housing significantly reduces performance of the communications module or renders the device inoperable. Because of the problems associated with mounting an antenna inside of a housing such as a metal box, the communications module and antenna are typically mounted separately from the LED driver electronics and are mounted external to the driver module housing. Moreover, the communications module and antenna typically are mounted at a distance from the metal electronics housing for the driver module to prevent the metal in the housing from adversely affecting performance of the communications module. Use of an external antenna also presents design problems in lighting devices because the external antenna is difficult to incorporate into the acceptable aesthetics of lighting device design.

In some embodiments of the invention the antenna for the communications module is a slot antenna formed in the electronics housing such that the communications module can be collocated with the driver module inside of the electronics housing. As a result the lamp of the invention does not require a separate housing for the communications module that must be located relative to the housing for the driver module so as to not degrade performance of the antenna and communications module. As a result the design of the overall structure and appearance of the lamp is simplified.

Figure 17:
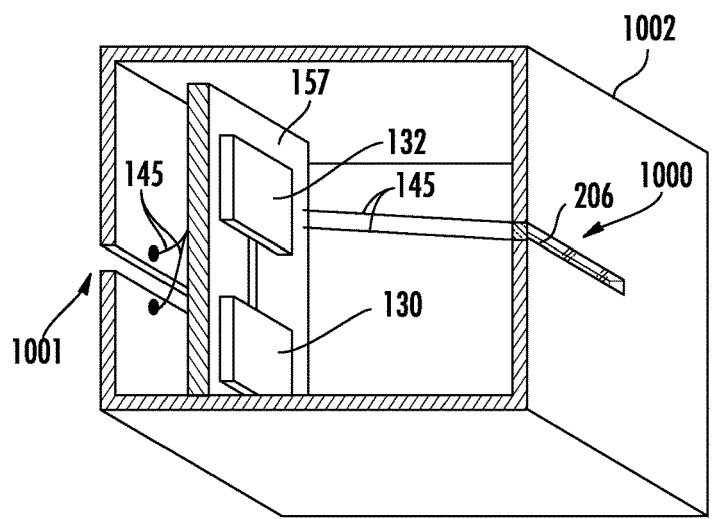
FIG. 17 is a perspective section view of another embodiment of the electronics housing of the invention.

The lamp electronics comprise a driver module 130 and a communications module 132 mounted in electronics housing 110, 1304 and 126 (FIGS. 1-6). The electronics housing 126 may comprise a UL rated housing that isolates the electronics in the electronics housing from the external environment. A UL approved electronics housing may include apertures that allow access to the interior of the electronics housing provided that the apertures are small enough or otherwise configured such that a standard test probe (used to simulate a human finger) cannot enter the electronics housing through the apertures. In one embodiment, the antenna 176 of communications module 132 comprises a slot antenna comprising a slot 10 formed in the UL approved electronics housing 110, 126, 1304. The slot 10 may have different sizes and shapes depending on the performance tradeoffs for the antenna such as frequency, gain, efficiency, ease of manufacture and the like; however, the slot may be dimensioned and configured such that the electronics housing is UL compliant where the slot 10 does not allow penetration by the probe. In some embodiments the slot may be filled or covered with a dielectric material such as plastic 200 to prevent any access into the electronics housing through the slot as shown in FIG. 17.

Figure 8:
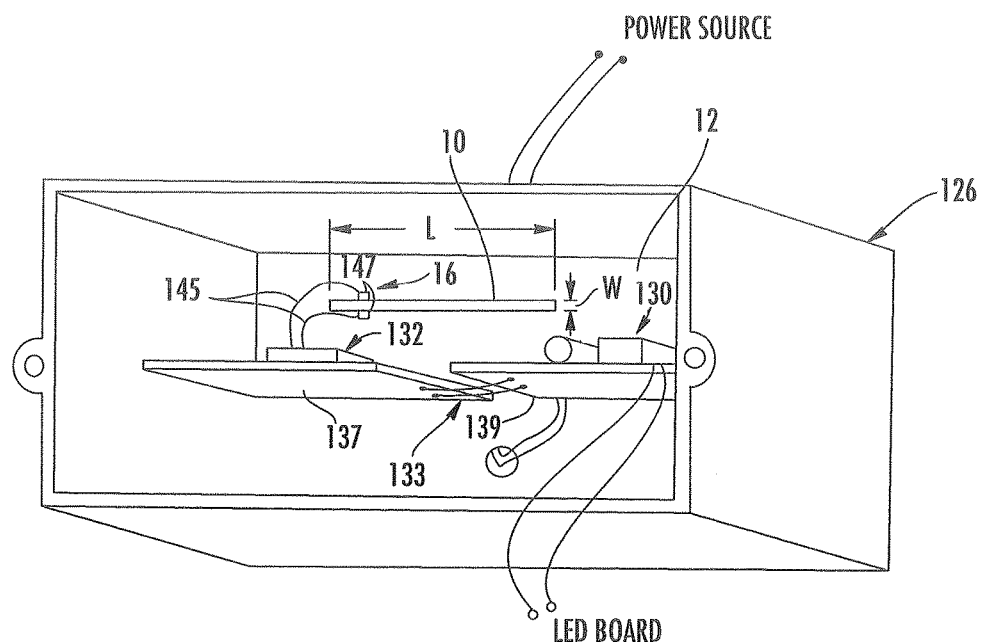
FIG. 8 is a perspective view of an electronics housing according to embodiments of the invention.
Figure 9:
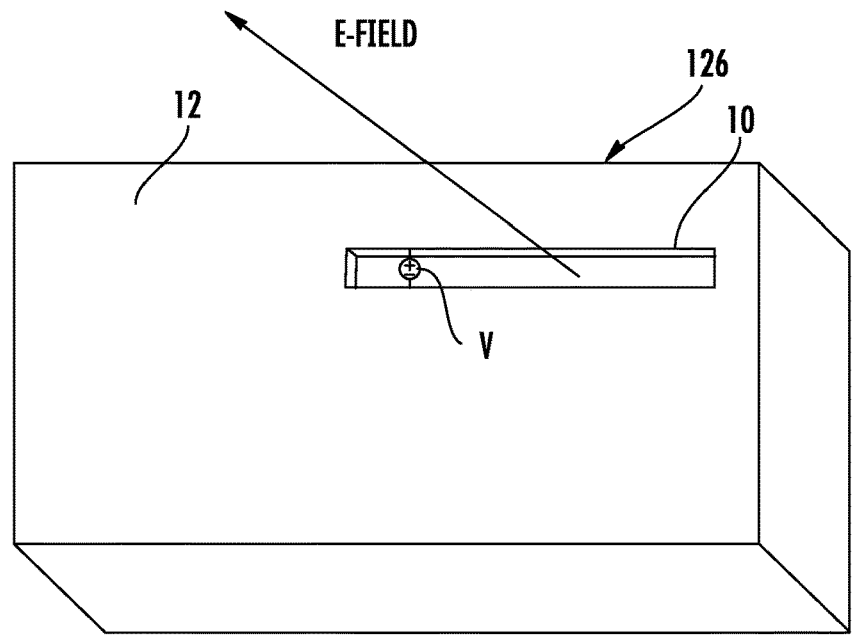
FIG. 9 is a schematic view of the electronics housing of FIG. 8.

FIG. 8 shows an internal view of an electronics housing 126 provided with a slot 10 that forms the slot antenna. The housing 126 may be closed by a separate cover (not shown) or the open side of the electronics housing may be mounted against the lamp housing to close the open side of the electronics housing. The slot 10 is formed in one side or plate 12 of the housing 126 where the side of the housing comprises a suitable material, such as metal, that creates an E-field when a voltage is applied across the slot 10. In some embodiments the slot comprises a linear slot having a length L significantly greater than its width W. The slot length L may be a half wavelength, or other integer multiplier of the wavelength, at the desired frequency and the width W is a small fraction of a wavelength. While the slot is shown as a linear slot, the slot 10 may have a variety of shapes and sizes provided that the dimensions of the slot are UL compliant if UL compliance is desired. In one embodiment the RF signal is connected directly to the housing on either side of the slot 10 to generate an E-field within the slot 10. The voltage source V is applied across the short dimension W of the slot 10 to induce the E-field distribution within the slot 10 as graphically represented in FIG. 9.

Figure 10:
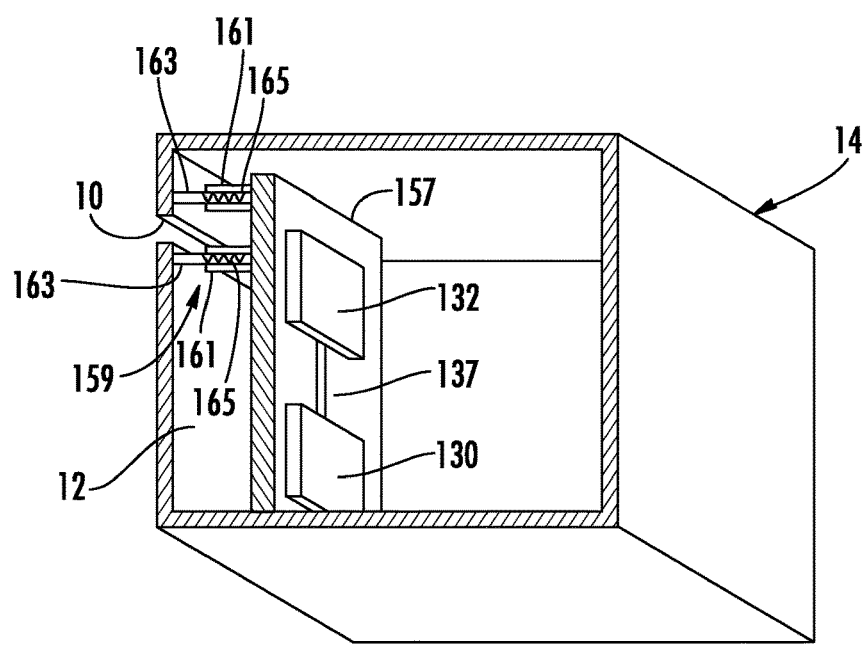
FIG. 10 is a perspective section view of another embodiment of the electronics housing of the invention.

In the embodiment of FIG. 8 the communications module 132 and the driver module 130 are shown on separate PCB boards 137 and 139, respectively. The boards being electrically coupled by a power and communication bus 133. The RF signal is connected to the electronics housing 126 over electrical conductors such as wires 145 that may be connected to wall 12 of electronics housing 126 by soldering 147. In other embodiments the electrical conductors 145 may be connected to the wall 12 by a mechanical connection such as by a crimping of the electronics into engagement with the conductors 145, by a set screw arrangement, spring loaded receptacle or the like. In the embodiment shown in FIG. 10 the communications module 132 and the driver module 130 are shown on the same PCB board 157 rather than on separate boards as shown in FIG. 8. Moreover, the RF signal is delivered to plate 12 of housing 126 by a spring loaded connection rather than using a soldered connection shown in FIG. 8. The spring loaded connection may comprise spring connectors such as pogo pin connectors 159. Each pogo pin connector comprises a base 161 that is mounted to the PCB board 157 and is electrically coupled to the lamp electronics on the board. A plunger 163 is electrically coupled to the base 161 and is movable relative to the base. The plunger is biased to an extended position by a spring 165. When the board is mounted in the housing, the plungers 163 of the pogo connectors 159 engage the wall 12 on opposite sides of slot 10 and are depressed slightly to deform the spring. The spring exerts a force on the plungers 167 to maintain the plungers in contact with the wall 12. In the various embodiments described herein the boards may be supported in the electronics housing on suitable support members and may be attached thereto by fasteners such as screws, adhesives, clamps or the like. The various arrangements described with respect to the embodiments described herein may be used in various combinations.

In other embodiments, the lighting device may comprise a lamp 600 having the form factor of a legacy omnidirectional incandescent light bulb such as an A-series bulb as shown in FIG. 11. The lamp 600 may comprise a base 602 having an Edison connector 603 and an electronics housing 605. The electronics housing 605 may at least partially retain a printed circuit board 680 and lamp electronics 610 suitable for powering the lamp and including a driver module. The lamp may further comprise a communications module 640 that may be on the same PCB 680 as the electronics for powering the lamp or on a separate PCB. The lamp may comprise an LED assembly 630 comprising multiple LEDs 627 mounted on a submount 629 to form an LED array. The submount 629 is mounted on and is thermally coupled to the tower or heat conducting portion 652 of a heat sink that extends into the optically transmissive enclosure 612. The heat sink may further comprise a heat dissipating portion 654 that extends to the exterior of the lamp to dissipate heat to the ambient environment. Electrical conductors 664 connect the lamp electronics on PCB 680 to the LEDs to provide critical current to the LEDs.

The lamp 600 also comprises an antenna 650 on the electronics housing 605 of the base 602 that transmits and receives wireless signals and that communicates with the communications module 640. The antenna comprises a slot 651 formed in the metal electronics housing 605 that is configured to function as a slot antenna as previously described. The RF signal is connected to the electronics housing 605 on either side of the slot 10 by conductors 652 to generate an E-field within the slot 10. The conductors 652 may be connected to electronics housing 605 by soldering, mechanical connection, spring connectors such as pogo pin connectors, or the like as previously described. The electronics housing 605 may be covered by a shell 607 made of a dielectric material such as plastic.

Figure 12:
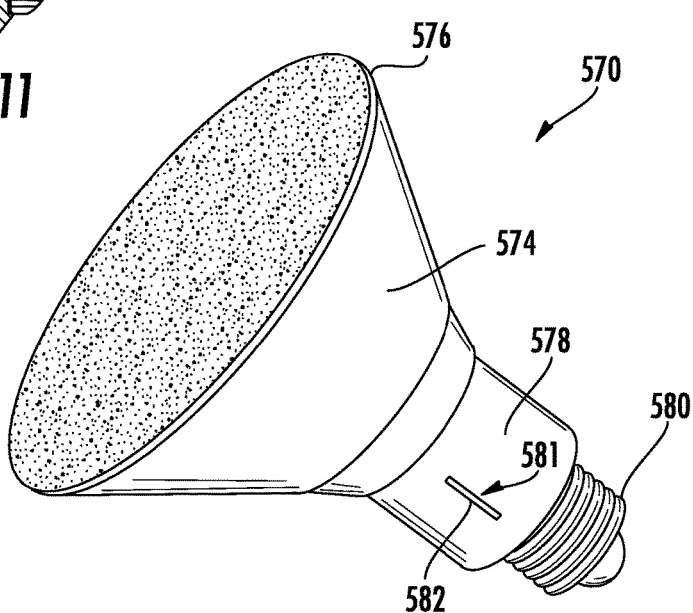
FIG. 12 is a perspective view of a lighting device according to still other embodiments of the invention.

In another embodiment the lighting device may comprise a lamp 570 having the form factor of a legacy directional light bulb such as reflector type light bulb such as a PAR or a BR style lamp as shown in FIG. 12. The lamp 570 may comprise a reflector 574 and an optical element such as a lens 576. A base having an Edison connector 580 and an electronics housing 578 may be connected to the reflector 574. The lamp may also comprise multiple LEDs (not shown in FIG. 12) that may be illuminated through an electrical path from the base. The electronics housing 578 may include a printed circuit board and lamp electronics suitable for powering the lamp and including a power supply and/or driver module. The electronics housing 578 may further comprise a communications module that may be on the same PCB as the driver module or on a separate PCB as previously described. An antenna 581 is provided for transmitting and receiving radio signals from and to the communications module. The antenna 581 may comprise a slot 582 formed in electronics housing 578 and may be constructed as described with respect to the embodiment of FIG. 11.

Figure 13:
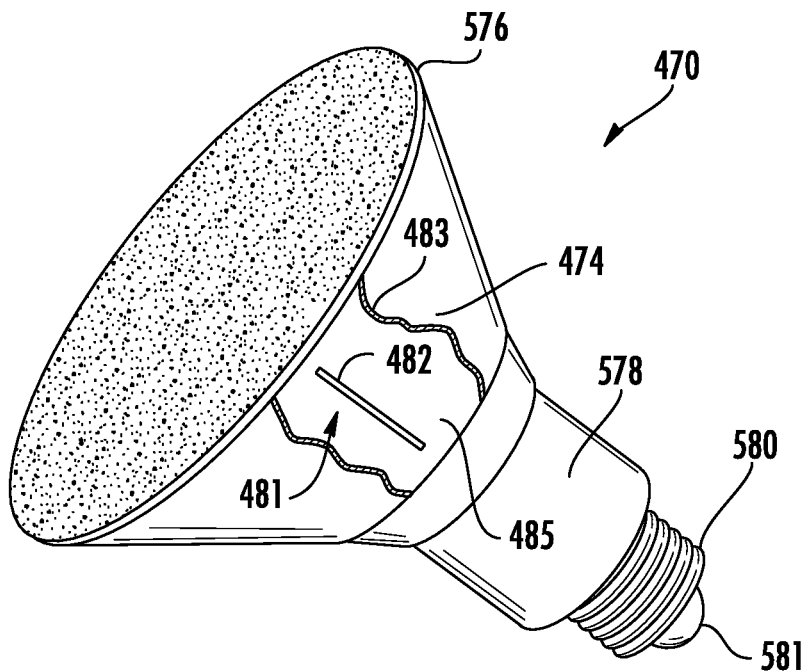
FIG. 13 is a perspective view of a lighting device according to yet other embodiments of the invention.

In another embodiment a directional lamp 470 is shown in FIG. 13 that is constructed similarly to lamp 570 of FIG. 12 except for the configuration of the antenna 481. In the embodiment of FIG. 13 the antenna 481 is formed in the reflector 474 rather than in the electronics housing 578. In one embodiment the reflector 474 may comprise a metal reflector having a slot 482 formed therein that forms the slot antenna. Conductors run from the communications module in the base to the slot 482 to apply the voltage source across the slot and generate the E field. In one embodiment the reflector 474 is formed of an outer shell 483 (cut-away in FIG. 13 to show the inner reflective layer) that may be made of glass, plastic, ceramic or the like. A reflective metal layer 485 may be formed inside the shell 483 to reflect light emitted by the LEDs. A slot 482 may be formed in the metal layer 485 that forms the slot antenna where the slot is covered on the outside of the lamp by the shell 483. The inner reflective metal layer 485 may be formed as a metalized coating applied to the shell or it may be a separate structural component positioned inside of the shell.

Figure 14:
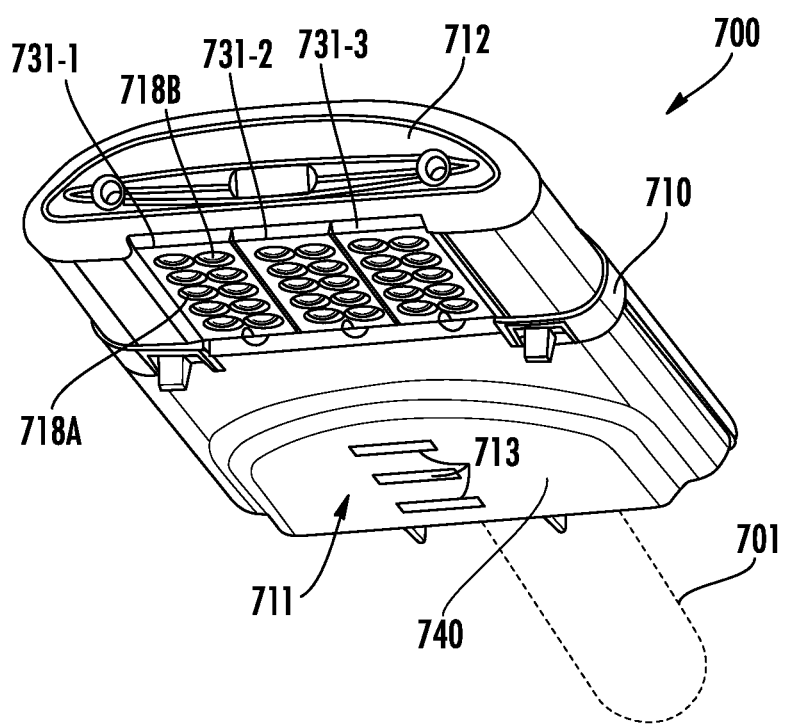
FIG. 14 is a perspective view of a lighting device according to still other embodiments of the invention.
Figure 15:
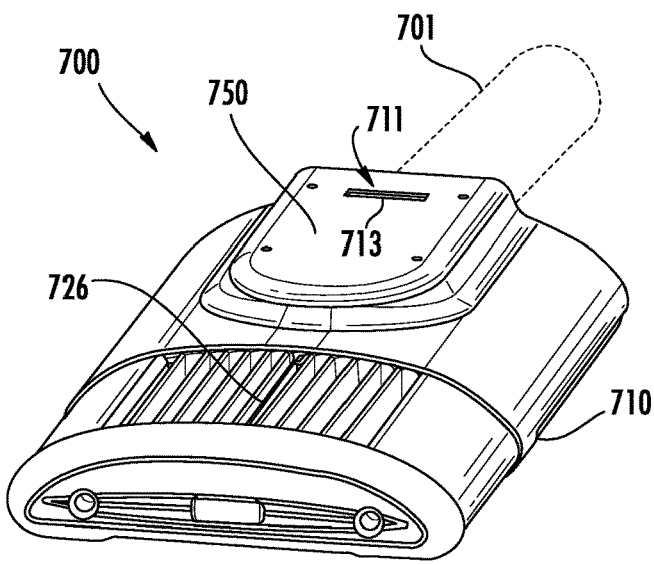
FIG. 15 is a perspective view of a lighting device according to yet other embodiments of the invention.

In another embodiment, the lighting device may comprise an outdoor lamp 700 such as a floodlight such as a street or roadway light as shown in FIGS. 14 and 15. The lamp may comprise an electronics housing 710 supported on a pole 701 or other structure. Multiple LEDs are arranged in an array along a lower surface of the electronics housing 710. In one embodiment multiple LED modules 731-1, 731-2, 731-3 each including multiple LEDs 718A, & 718B arranged in an array are provided along lower surface 740 of lamp 700 between the support pole 701 and end cap 712 of electronics housing 710. Heat may be dissipated from the LEDs to the ambient environment by a heat spreader 726. The electronics housing 710 may contain a printed circuit board and lamp electronics suitable for powering the lamp and including a driver module and a communications module as previously described. The communications module may be on the same PCB as the electronics for powering the lamp or on a separate PCBs. An antenna 711 is provided for transmitting and receiving radio signals. In the embodiment of FIG. 15 the antenna 711 may be formed as a slot 713 in top surface 750 of the electronics housing 710. Conductors run from the communications module in the electronics housing 710 to the slot 713 to apply the voltage source across the slot and generate the E field as previously described. In the embodiment of FIG. 14 a plurality of slots 713 are formed in the bottom surface 740 of the electronics housing to form antenna 711.

Figure 16:
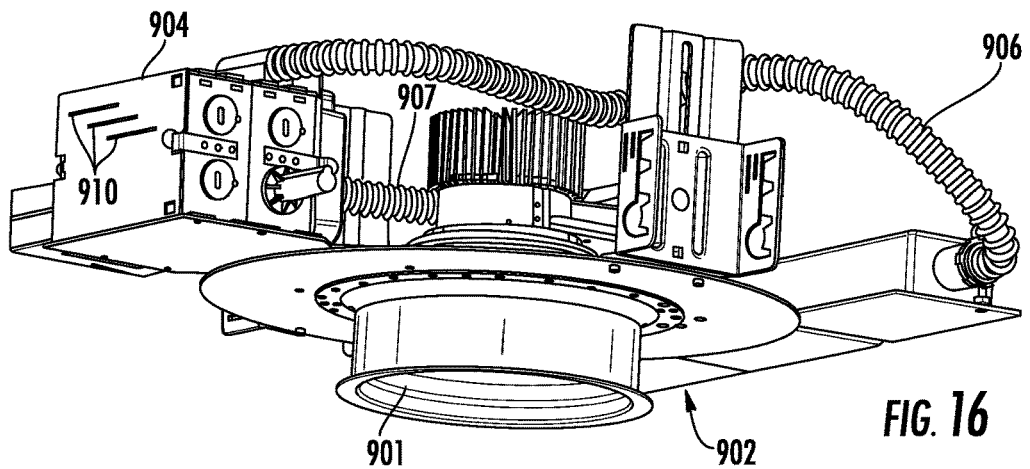
FIG. 16 is a perspective view of a lighting device according to still other embodiments of the invention.

As shown in FIGS. 14, 16 and 17 more than one slot may be used to form the antenna in some embodiments of the invention. The lighting device 900 of FIG. 16 is a down light and may comprise a reflector 901 in which the LED array is mounted. A lamp housing 902 supports the reflector 901 for mounting in a structure such as a ceiling. Electronics housing or circuit box 904 is supported by the frame on the backside of the lighting device. Electronics housing 904 contains the electronics used to drive and control the light sources such as rectifiers, regulators, timing circuitry, and other components and a communications module as previously described. Electrical conductors in conduits 906 deliver current from the power source to the lamp electronics and conductors in conduit 907 delivers critical current from the lamp electronics in electronics housing 904 to the LEDs. A plurality of slots 910 may be formed in the housing 904 and each slot may be independently fed with a voltage source across the slot. However, in other embodiments the housing may be used as the transmission line to feed the elements. Use of multiple slots may be used advantageously for multiband applications where different ones of the slot antennas operate at different bands.

Referring to FIG. 17 in other embodiments multiple slot antennas 1000, 1001 comprising slots 10 provided with an RF signal via conductors 145 as previously described. Slot antennas 1000, 1001 may be used on opposite sides of the electronics housing 1002. Use of slot antennas on opposite sides of the housing 1002 may be used in applications where a multi-directional antenna is desired.

Where the slot antenna is formed in the electronics housing 126 or other similar three-dimensional structure the antenna may be considered a cavity-backed slot antenna. The volume of the cavity typically influences the bandwidth where a larger volume often yields a higher bandwidth. In some embodiments the cavity may be filled with air or it may be filled with a dielectric medium.

Figure 18:
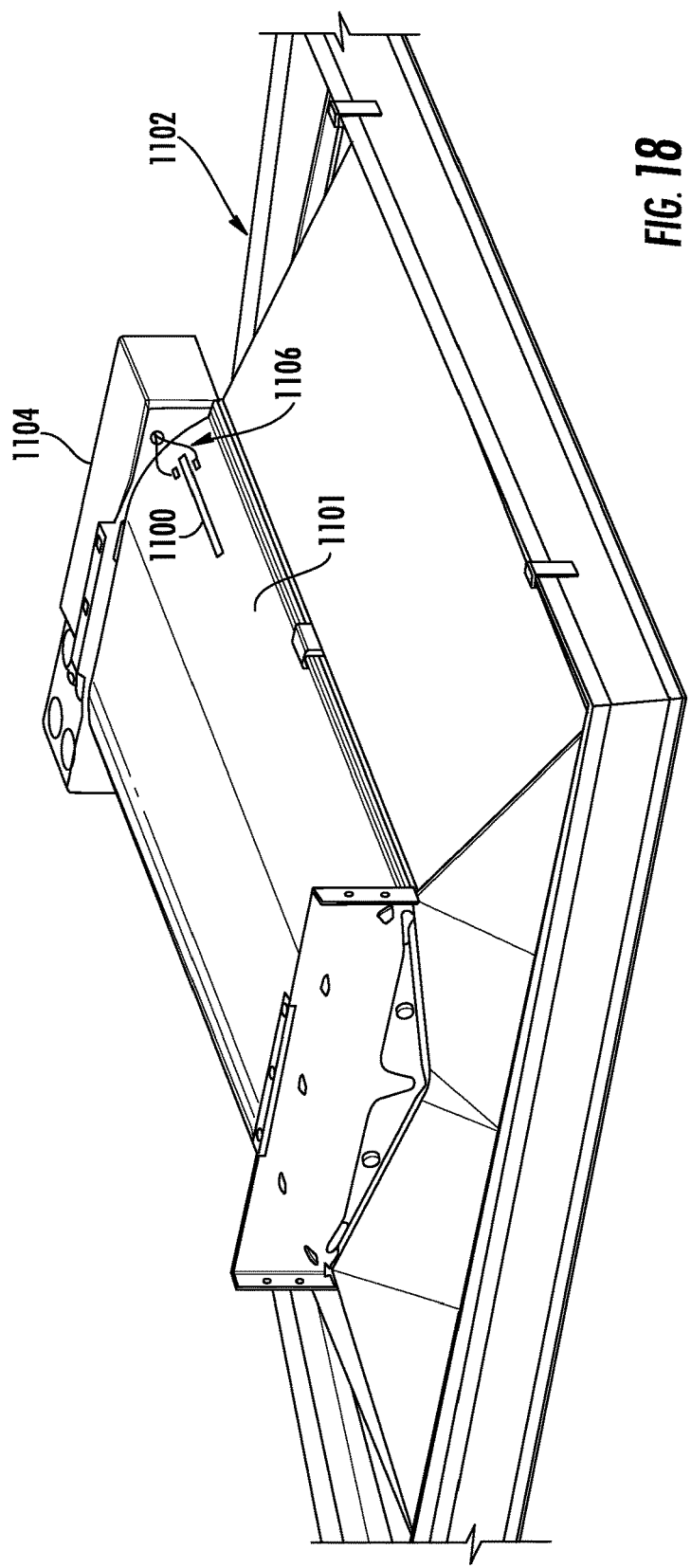
FIG. 18 is a top perspective view of a lighting device according to yet other embodiments of the invention.
Figure 19:
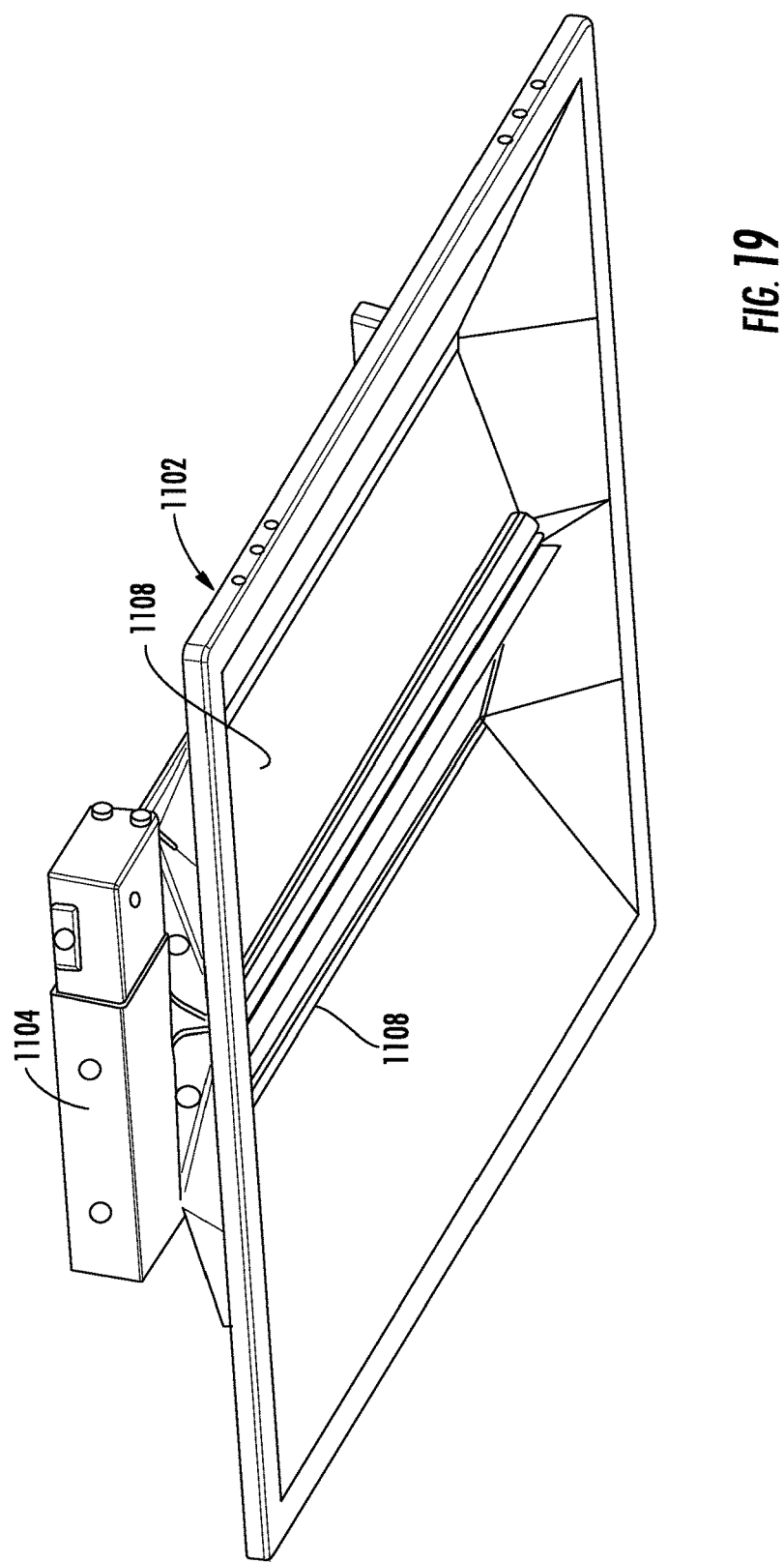
FIG. 19 is a bottom perspective view of the lighting device of FIG. 18.
Figure 20:
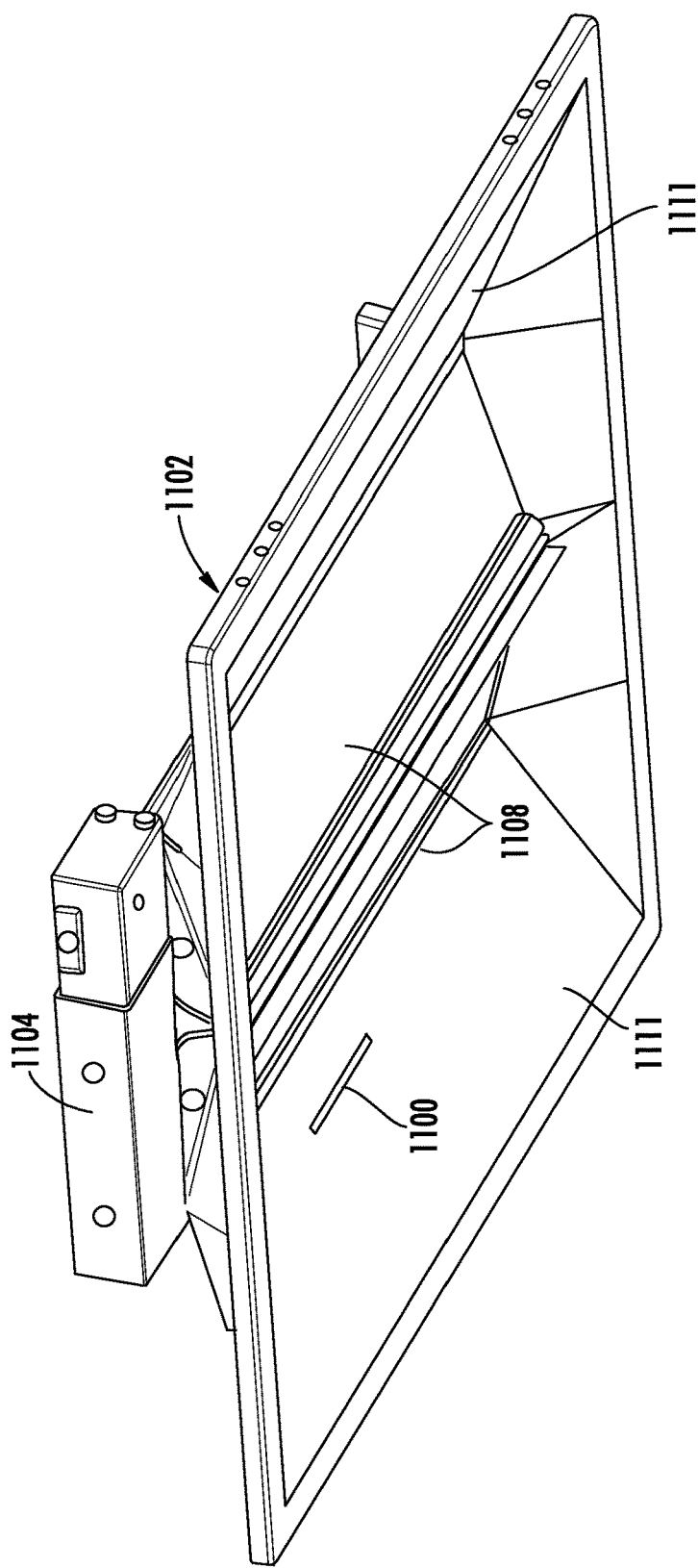
FIG. 20 is a bottom perspective view of a lighting device according to yet other embodiments of the invention.

In some embodiments the slot antenna may formed in the lamp housing rather than in the electronics housing for the communications module and power module. For example, as shown in FIGS. 18 and 19 the slot 1100 for the slot antenna is formed in one metal section or plate 1101 that forms the lamp housing 1102. In this manner the antenna may be located anywhere on the lamp housing 1102 where a metal plate may be incorporated that forms part of the light structure. The electronics housing 1104 may contain a printed circuit board and lamp electronics suitable for powering the lamp and include a driver module. The electronics housing 1104 may further comprise a communications module that may be on the same PCB as the electronics for powering the lamp or on a separate PCB. Conductors 1106 run from the communications module in the housing 1104 to the slot 1100 to apply the voltage source across the slot and generate the E field as previously described. The slot 1100 is formed in the lamp housing 1102 in an area that is covered by the lenses 1108 such that the slot 1100 is not visible from the exposed portion of the lamp during normal use of the lighting device (see FIG. 19). While providing the slot 1100 in an area of the lamp that is hidden from view, such as behind a diffusive lens 1108, may be aesthetically preferable, the slot 1100 may be formed in an exposed area of the lamp if desired as shown in FIG. 20. In this embodiment the slot 1100 is formed in the exposed reflector 1111 of lamp housing 1102 rather than behind the lenses 1108.

Figure 21:
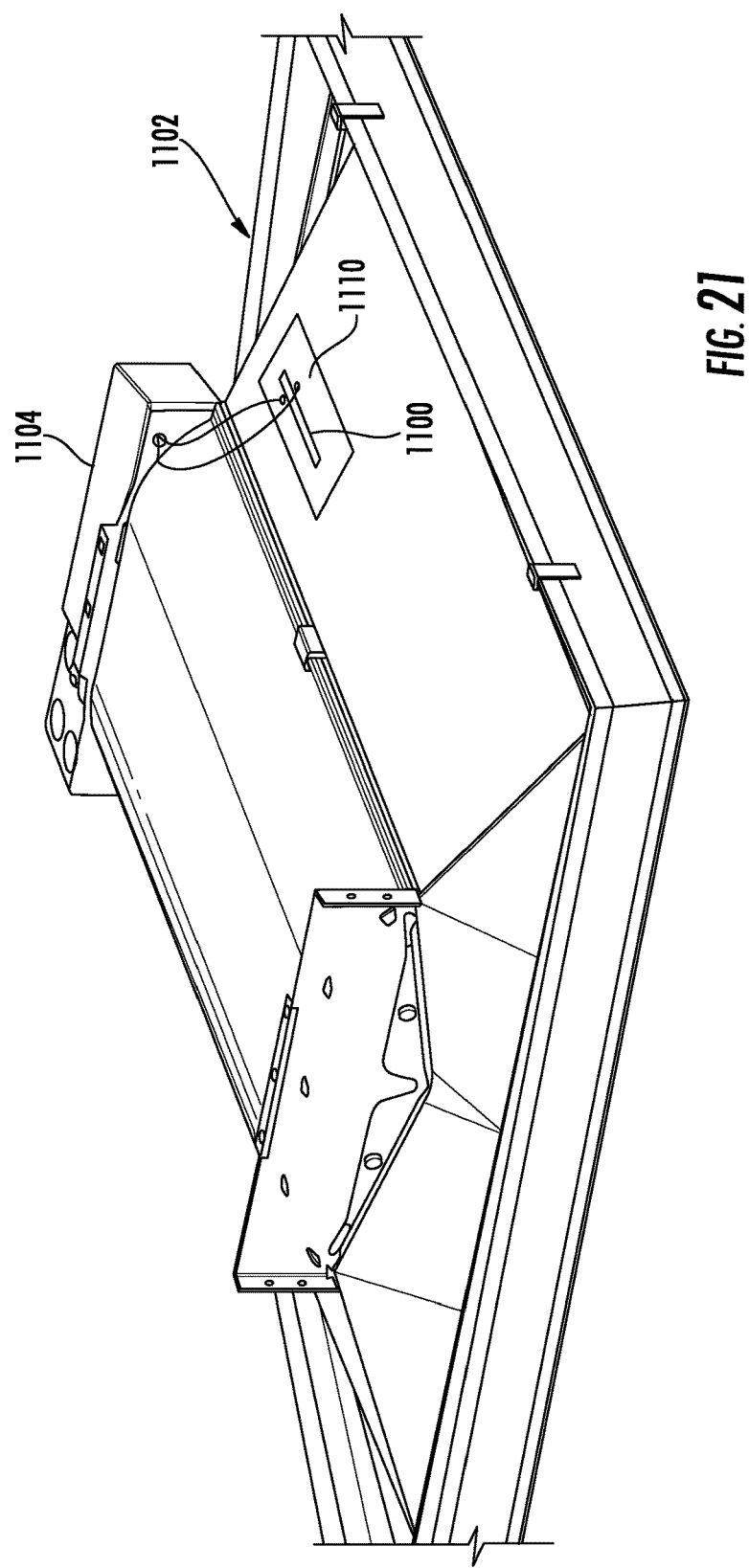
FIG. 21 is a top perspective view of a lighting device according to yet other embodiments of the invention.
Figure 22:
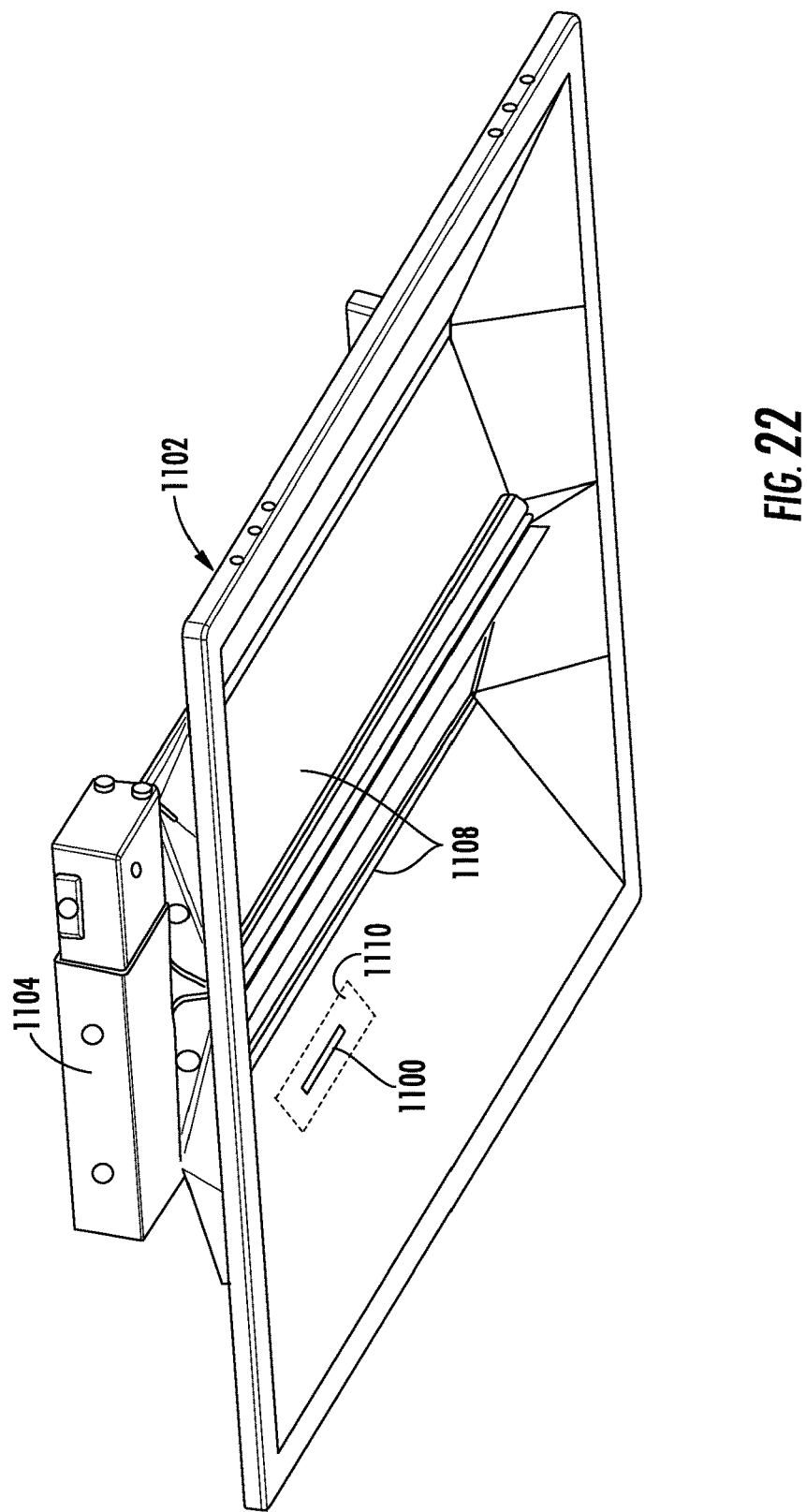
FIG. 22 is a bottom perspective view of the lighting device of FIG. 21.

In some embodiments the metal plate that forms the slot antenna may be incorporated into the lamp housing even if the overall lamp housing is made of a material that is not suitable for use as the slot antenna. For example, as shown in FIGS. 21 and 22 if the lamp housing 1102, or portions of the lamp housing, is formed of plastic, a metal plate 1110 in which the slot 1100 for the slot antenna is formed may be incorporated into the lamp housing such that the metal plate 1110 may be visually hidden from view. For example, the plate 1110 of the antenna may be incorporated into the housing such that antenna forms a portion of the housing that is visually indistinguishable from the remainder of the housing (as represented by dashed lines in FIG. 22). The plate may be visually indistinguishable from the remainder of the lamp housing that is exposed during normal use. The plate may be visible from the backside of the lighting device. Where the lamp housing comprises a flat member the surface of the plate 1110 that forms the antenna may be considered to be coplanar with the housing portion in which it is incorporated as shown in FIGS. 21 and 22. Where the housing portion is a curved member the surface of the plate 1110 that forms the antenna may form a smooth uninterrupted continuation of the curved housing surface. The exposed surfaces of the plate and lamp housing may be painted, coated or otherwise treated to further conceal the plate. In other embodiments the plate may 1110 be positioned such that the plate 1110 is disposed behind the lenses 1108 such that it does not have to match the look of the remainder of the lamp housing.

By using the lamp housing and/or the electronics housing as the antenna the antenna may be used at various locations on the light fixture. The slot antenna may be used with any lighting device that has a metal housing or that can incorporate a metal plate as part of the housing. The antenna may function as both a mechanical support as part of the lamp structure and as a radiating antenna. The design of the invention may be used to hide antennas from view to preserve the aesthetics of the lighting device.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A LED lighting device comprising:
   at least one LED operable to emit light for general illumination when powered through an electrical path;
   a driver module in the electrical path for providing power to the at least one LED;
   an electronics housing retaining the driver module;
   a communications module for enabling wireless communication to and/or from the LED lighting device, wherein the communications module is retained in the electronics housing;
   an antenna operatively coupled to the communications module for receiving and/or transmitting a wireless signal, the antenna comprising a slot in the electronics housing.

2. The LED lighting device of claim 1 wherein the electronics housing forms part of a reflector surface.

3. The LED lighting device of claim 1 wherein the antenna is a cavity-backed antenna.

4. The LED lighting device of claim 1 wherein the slot comprises a linear slot.

5. The LED lighting device of claim 4 wherein the linear slot has a length significantly greater than its width.

6. The LED lighting device of claim 1 further comprising an external heat sink.

7. The LED lighting device of claim 1 wherein the slot comprises a plurality of slots.

8. The LED lighting device of claim 7 wherein a voltage source is applied across each of the plurality of slots to induce an E-field distribution within each of the plurality of slots.

9. The LED lighting device of claim 1 wherein the electronics housing is separately mounted to the lighting device.

10. The LED lighting device of claim 1 further comprising a support structure for securing the lighting device to a structure.

11. A LED lighting device comprising:
at least one LED operable to emit light when powered through an electrical path;
a reflector positioned to reflect at least a portion of the light emitted by the at least one LED;
lamp electronics in the electrical path for providing power to the at least one LED;
a housing;
a communications module for enabling wireless communication to and from the LED lighting device;
an antenna operatively coupled to the communications module for receiving and transmitting a wireless signal, the antenna comprising a slot in the reflector.

12. The LED lighting device of claim 11 wherein the lamp electronics are retained in the housing.

13. The LED lighting device of claim 11 wherein the housing forms part of a lamp housing.

14. The LED lighting device of claim 11 wherein the communications module is retained in the housing.

15. The LED lighting device of claim 11 wherein the reflector comprises a first portion that forms part of the antenna and a second portion that does not form part of the antenna.

16. The LED lighting device of claim 15 wherein the first portion is visually indistinguishable from the second portion.

17. The LED lighting device of claim 11 wherein the antenna is a cavity-backed antenna.

18. The LED lighting device of claim 11 wherein the antenna comprises a plurality of slots.

19. The LED lighting device of claim 11 wherein a voltage source is applied across the slot to induce an E-field distribution within the slot.

20. A LED lighting device comprising:
at least one LED operable to emit light for general illumination when powered through an electrical path;
lamp electronics in the electrical path for providing power to the at least one LED;
a housing for retaining the lamp electronics;
a communications module for enabling wireless communication to and/or from the LED lighting device;
an antenna for receiving and/or transmitting a wireless signal, the antenna comprising a slot in the housing;
electrical conductors in the electrical path extending from the housing for connecting the LED lighting device to a permanent source of power.

21. A LED lighting device comprising:
at least one LED operable to emit light for general illumination when powered through an electrical path;
a driver module in the electrical path for providing power to the at least one LED;
an electronics housing for retaining the driver module;
a communications module for enabling wireless communication to and/or from the LED lighting device;
an antenna for receiving and transmitting a wireless signal, the antenna comprising a slot in the electronics housing;
an electrical connector in the electrical path configured to be received in an electrical socket for delivering current to the driver module.

* * * * *